United States Patent
Han et al.

[11] Patent Number: 6,133,629
[45] Date of Patent: Oct. 17, 2000

[54] MULTI-CHIP MODULE PACKAGE

[75] Inventors: Charlie Han; Ming-Huang Hung, both of Hsinchu Hsien, Taiwan

[73] Assignee: United Microelectronics Corp., Hsinchu, Taiwan

[21] Appl. No.: 09/299,681

[22] Filed: Apr. 26, 1999

[51] Int. Cl.[7] .................................................. H01L 23/04
[52] U.S. Cl. .......................... 257/698; 257/786; 257/723; 257/724
[58] Field of Search .................................. 257/698, 723, 257/724, 685, 686, 773, 786

[56] References Cited

U.S. PATENT DOCUMENTS

| | | |
|---|---|---|
| 5,468,997 | 11/1995 | Imai et al. . |
| 5,475,264 | 12/1995 | Sudo et al. . |
| 5,780,926 | 7/1998 | Seo . |
| 5,841,191 | 11/1998 | Chia et al. . |
| 6,002,178 | 12/1999 | Lin . |

*Primary Examiner*—Sheila V. Clark
*Attorney, Agent, or Firm*—Hickman Coleman & Hughes, LLP

[57] ABSTRACT

A repairable multi-chip module which is used when failures are found after an electrically and functionally testing is described. A substrate is provided. At least a first normal die having a plurality of first pads is mounted on the substrate, wherein the first normal die is surrounded by the pads. At least a failed die is mounted on the substrate. Several third pads and fourth pads are mounted on the substrate, wherein the third pads surrounds the first normal die and the failed die and the fourth pads surrounds the first pads. At least a second normal die having a plurality of second pads is stacked over the failed die. Several conductive wires are electrically connecting the first pads on the first normal die and the third pads. Several reworking conductive wires are electrically connecting the second pads on the second normal die and the fourth pads.

20 Claims, 4 Drawing Sheets

MULTI-CHIP MODULE PACKAGE

BACKGROUND OF THE INVENTION

1. Field of the Invention

The present invention relates to a package. More particularly, the present invention relates to a repairable multi-chip module.

2. Description of the Related Art

Typically, an integrated circuit (IC) manufacturing process includes three stages: wafer preparation, IC fabrication, and IC packaging. The purpose of the IC packaging is to provide an electrical medium between the die and the printed circuit board (PCB) or other proper devices and to protect the die.

In the integrated circuit module, a massive amount of the conductive wires is used to electrically connect the die and the substrate as the integration is increased. Typically, the die is electrically coupled to the PCB through a lead frame. When the integration of the integrated circuit becomes higher and the volume of the package is maintained or shrunk, the amount of the conductive wires between the die and the substrate is greatly increased. Therefore, the numbers of the conventional lead frame is insufficient. Several different package technologies such as chip scale package and chip size package (CSP) are developed to accommodate a massive amount of the conductive wires and to package the relatively complex circuit.

FIG. 1 is a schematic, cross-sectional view of a conventional multi-chip module (MCM) package. The MCM package comprises an MCM substrate 100, dies 108a and 108b, pads 102 and solder ball pads 104. The dies 108a and 108b and the pads 102 are located on one surface 116a of the MCM substrate 100. The solder-ball pads 104 are mounted on the other surface 116b of the MCM substrate 100. The pads 102 are electrically coupled to the solder-ball pads 104 through the electrical connecting paths 106. Each pad 102 on the MCM substrate 100 is electrically coupled to each pad (not shown) on the dies 108a and 108b through respective wires 110 formed by wire bonding. Additionally, the MCM package also comprises a resin used to cover the dies 108a and 108b, the wires 110, the pads 102 and the MCM substrate 100. Moreover, the MCM package further comprises several solder balls 114. The solder balls 114 mounted on the solder-ball pads 104 to form a ball grid array (BGA).

Typically, the electrically testing process is performed after the dies 108a and 108b are molded by the resin 112. Since the quality of the dies 108a and 108b in the multi-chip package (MCP) process are different, the yield and the reliability of the package product are worse. When the electrically testing result shows that the package product can not normally act and one of the dies 108a and 108b is failed, the reworking process can not be performed since the dies 108a and 108b are molded by the resin 112. Therefore, the other die with normal function is dumped with the MCM having the failed die formed therein. Hence, the cost is increased. If the repairing process is performed on the failed die, the wires 110 used to respectively electrically connect the pads 102 and the pads on the failed die should be removed. However, the substrate 100 is damaged by removing the wires 110. Hence, the yield and the reliability are decreased.

SUMMARY OF THE INVENTION

The invention provides a repairable multi-chip module. By using the invention, it is unnecessary to dump the failed die with the normal die and the cost can be decreased. Moreover, the yield and the reliability of the package product can be greatly improved.

To achieve these and other advantages and in accordance with the purpose of the invention as embodied and broadly described herein, the invention provides a repairable multi-chip module which is used when failures are found after an electrically and functionally testing. A substrate is provided. At least a first normal die having a plurality of first pads is mounted on the substrate, wherein the first normal die is surrounded by the pads. At least a failed die is mounted on the substrate. Several third pads and fourth pads are mounted on the substrate, wherein the third pads surrounds the first normal die and the failed die and the fourth pads surrounds the first pads. At least a second normal die having a plurality of second pads is stacked over the failed die. Several conductive wires are electrically connecting the first pads on the first normal die and the third pads. Several reworking conductive wires are electrically connecting the second pads on the second normal die and the fourth pads. Since the module can be immediately repaired by using the second normal die, it is unnecessary to dump the failed die with the normal die. Therefore, the cost can be decreased. Moreover by replacing the failed die with the second normal die, the yield and the reliability of the package product can be greatly improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
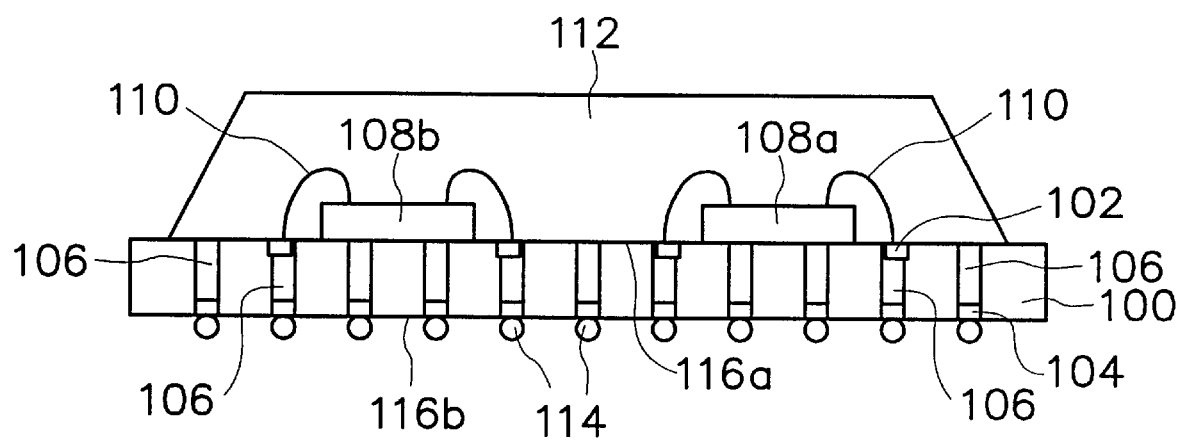
FIG. 1 is a schematic, cross-sectional view of a conventional multi-chip module (MCM) package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
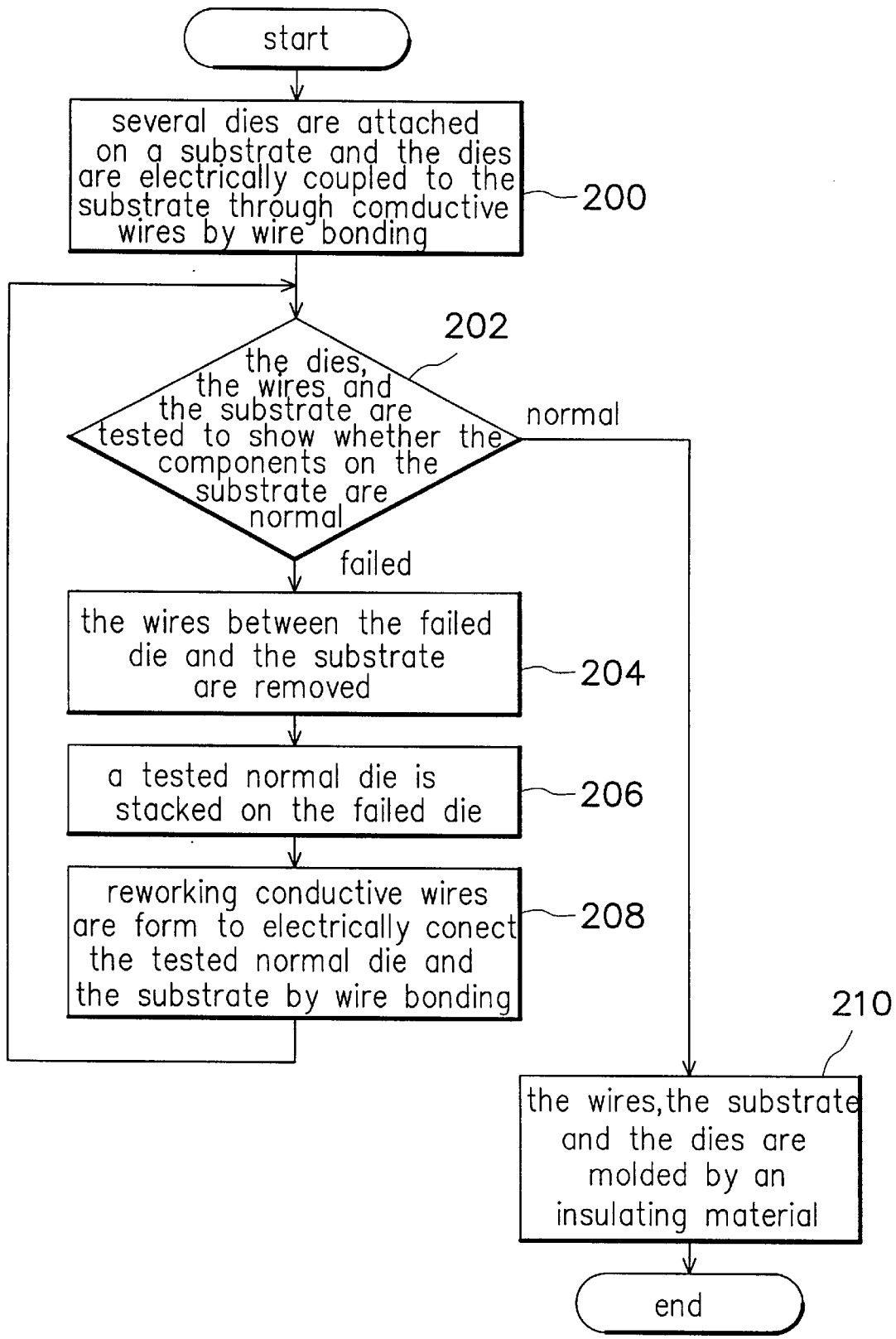
FIG. 2 is a flowchart of the process for manufacturing a repairable multi-chip module in a preferred embodiment according to the invention.

FIG. 2 is a flowchart of the process for manufacturing a repairable multi-chip module in a preferred embodiment according to the invention. FIGS. 3A through 3F are schematic, cross-sectional views of the process for manufacturing a repairable multi-chip module in a preferred embodiment according to the invention.

Figure 3A:
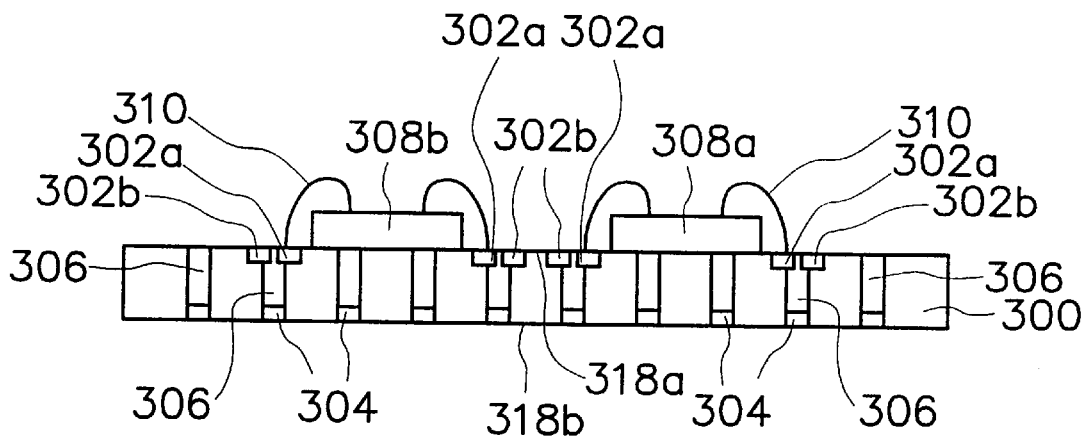
FIGS. 3A through 3F are schematic, cross-sectional views of the process for manufacturing a repairable multi-chip module in a preferred embodiment according to the invention.

As shown in FIG. 2 together with FIG. 3A, in step 200, a substrate 300 having dies 308a and 308b, pads 302a and 302b and contacts 304 is provided. The dies 308a and 308b and the pads 302a and 302b are formed at the same surface of the substrate 300, and the dies 308a and 308b and the contacts 304 are formed at different surface of the substrate 300. The pads 302a are located on the substrate 300 around the dies 308a and 308b, and the pads 302b are located on the substrate 300 adjacent to the pads 302a around the dies 308a and 308b. The pads 302a and 302b are electrically coupled to the contacts 304 through the electrical connecting paths 306. The method for mounting the dies 308a and 308b on the substrate 300 can be die attaching process with insulating paste, conductive paste or tape, for example. Each pad (not shown) is electrically coupled to each pad 302a through respective conductive wires 310 formed by wire bonding. The material of the conductive wire 310 can be aurum or aluminum.

Figure 3B:
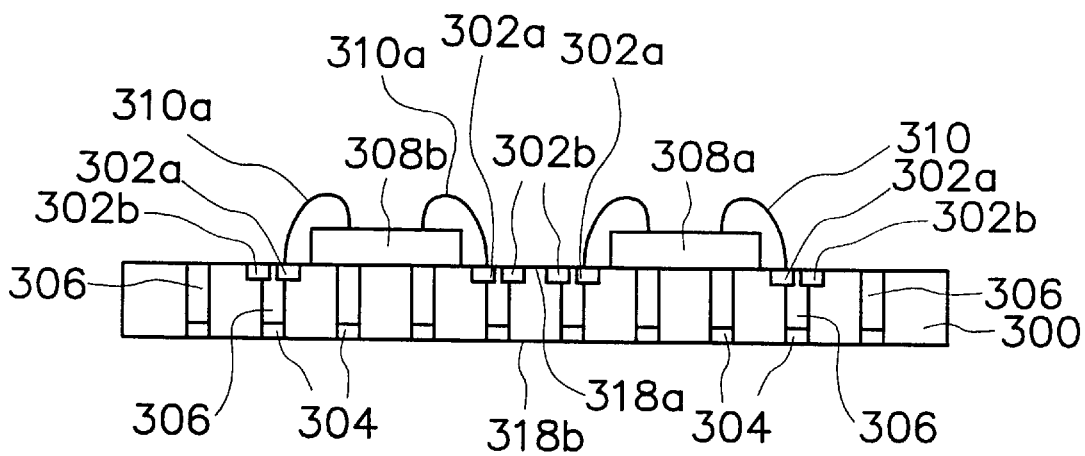

As shown in FIG. 2 together with FIG. 3B, in step 202, an electrically and functionally testing is performed to identify whether the dies 308a and 308b, the substrate 300 and the conductive wires are normal. The electrically and functionally testing can be performed by function testing system via the contacts 304, for example. If the result of the electrically and functionally testing shows that every component on the substrate 300 is fine, a step 210 (as shown in FIG. 2) including a molding process is performed. If the result of the electrically and functionally testing shows that there are some failures in dies or conductive wires, a serial step, that is steps 204, 206 and 208, is performed. In this preferred embodiment, the failure happens at the die 308b or the conductive wires 310 used to electrically connect the die 308b and the pads 302a. The failed conductive wires 310 are denoted as conductive wires 310a.

Figure 3C:
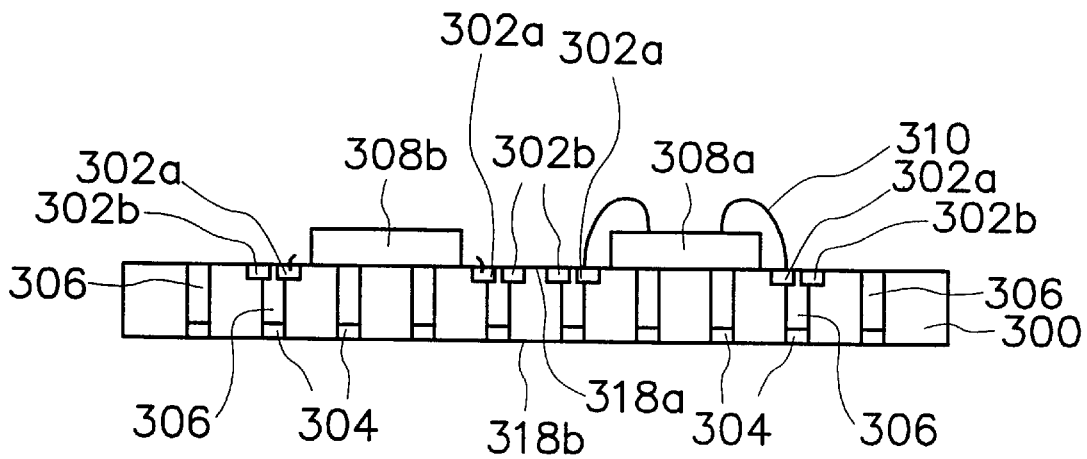

As shown in FIG. 2 together with FIG. 3C, in step 204, when the failure in the die 308b or the conductive wires 310a is found by the electrically and functionally testing, the conductive wires 302a electrically connecting the failed die 308b and the pads 302a are removed to cut off the electrically connecting between the die 308b and the substrate 300.

Figure 3D:
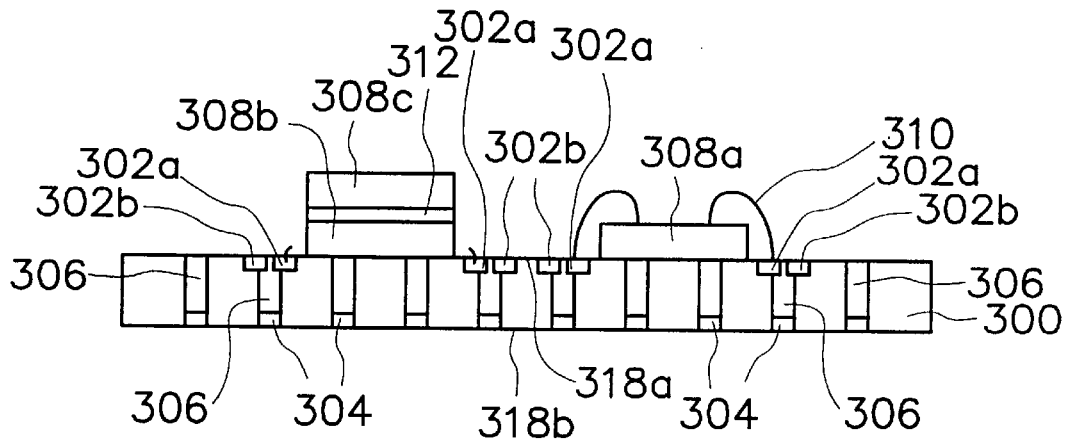

As shown in FIG. 2 together with FIG. 3D, in step 206, a die 308c is stacked on the die 308b through a binding material 312. The binding material 312 can be insulating paste or tape, for example. Additionally, the function of the die 308c is the same as that of the die 308b. The die 308c can be a common die or a normal die which have been previously tested, for example.

Figure 3E:
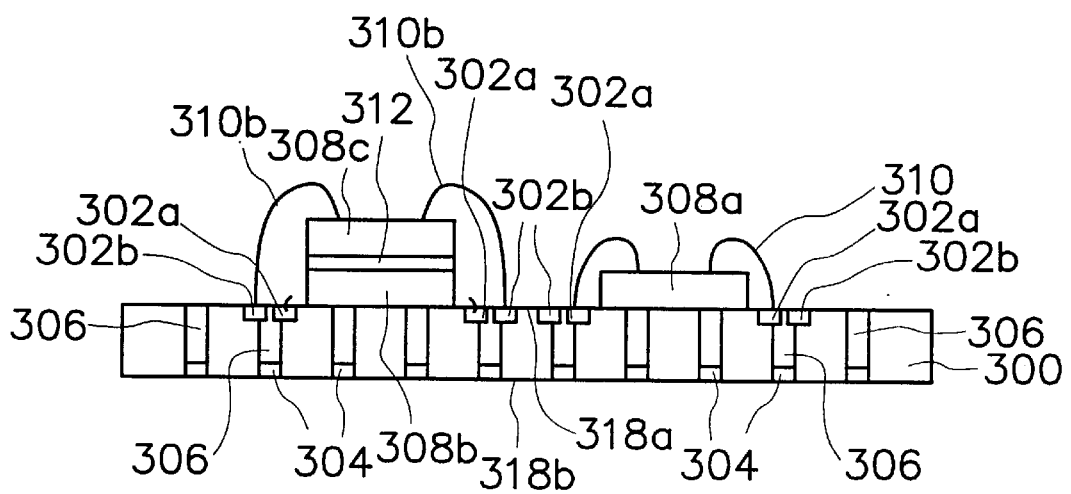

As shown in FIG. 2 together with FIG. 3E, in step 208, each pad (not shown) on the die 308c is electrically coupled to each pad 302b through relative reworking conductive wires 310b. The die 308c and the reworking conductive wires 310b are formed instead of the failed die 308b and the failed conductive wires 310a. The material of the reworking conductive wires 310b can be aurum or aluminum, for example.

Figure 3F:
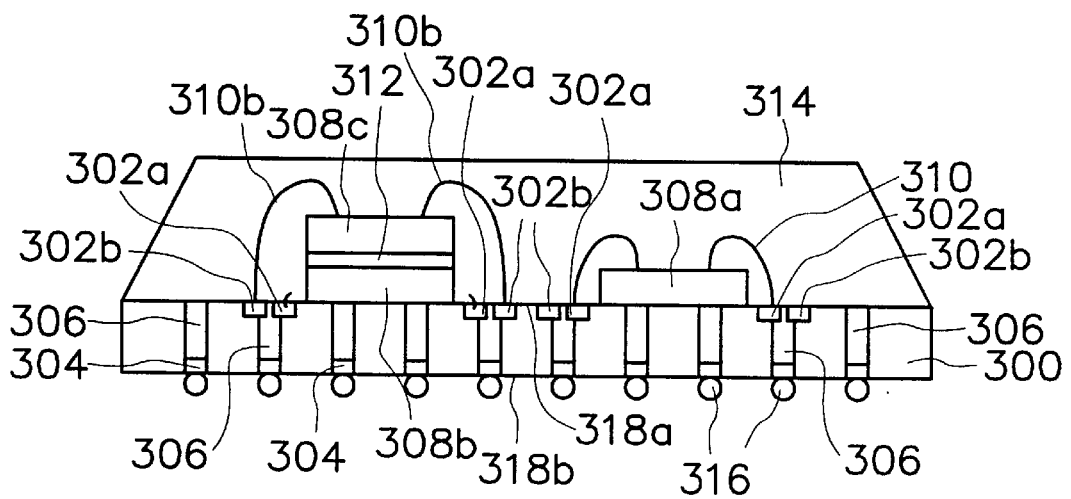

After the process for electrically connecting the die 308c and the substrate 300 is performed, the electrically and functionally testing is performed again to identify whether the components on the substrate 300 are normal. If the result of the electrically and functionally testing shows that the failures still exist in the components on the substrate 300, a serial step, that is the steps 204, 206 and 208, is performed again. If the result of the electrically and functionally testing shows that every component on the substrate 300 is regular, the step 210 (as shown in FIG. 2 and FIG. 3F) is performed. An insulating material 314 is formed to cover the dies 308a, 308b and 308c, the conductive wires 310, the reworking conductive wires 310b and the pads 302a and 302b. Solder material 316 is formed on the contacts 304. The solder material 316 is used as electrically coupling media between multi-chip module package and other circuit substrate. The insulating material 314 can be resin or epoxy, for example. The solder material 316 can be solder paste or solder ball, for example. When the solder balls are located on the surface of the contacts 304, it forms a BGA. When the solder pastes are mounted on the surface of the contacts 304, it forms a land grid array (LGA).

In the invention, since the electrically and functionally testing is performed before the molding process is performed with the insulating material 314, a new die (such as the die 308c shown in FIG. 3D) and reworking conductive wires is formed instead of the failed die and the failed conductive wires when the testing result shows that the die and the conductive wires are failed. By using the invention, the module can be immediately repaired. Therefore, it is unnecessary to dump the failed die with the normal die and the cost can be decreased. Moreover, by replacing the failed die with the tested die with normal functions, the yield and the reliability of the package product can be greatly improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A repairable multi-chip module which is used when failures are found after an electrically and functionally testing, comprising:

a substrate;

at least a first normal die having a plurality of first pads on the substrate, wherein the first normal die is surrounded by the pads;

at least a failed die on the substrate;

a plurality of third pads and fourth pads on the substrate, wherein the third pads surrounds the first normal die and the failed die and the fourth pads surrounds the first pads;

at least a second normal die having a plurality of second pads stacked over the failed die;

a plurality of conductive wires electrically connecting the first pads on the first normal die and the third pads; and a plurality of reworking conductive wires electrically connecting the second pads on the second normal die and the fourth pads.

2. The repairable multi-chip module of claim 1, wherein material of the conductive wires includes aurum.

3. The repairable multi-chip module of claim 1, wherein material of the reworking conductive wires includes aurum.

4. The repairable multi-chip module of claim 1, between the second normal die and the failed die, further comprises a binding material.

5. The repairable multi-chip module of claim 1, further comprises an insulating material covering the first surface of the substrate.

6. The repairable multi-chip module of claim 5, wherein the insulating material includes resin.

7. The repairable multi-chip module of claim 5, wherein the insulating material includes epoxy.

8. The repairable multi-chip module of claim 1, wherein the second normal die has been previously tested.

9. The repairable multi-chip module of claim 8, wherein the function of the second normal die is the same as that of the failed die.

10. A repairable multi-chip module which is used when failures are found after an electrically and functionally testing, comprising:

a substrate having a first surface and a second surface;

at least a first normal die having a plurality of first pads on the first surface of the substrate, wherein the first normal die is surrounded by the pads;

at least a failed die on the first surface of the substrate;

a plurality of third pads and fourth pads on the first surface of the substrate, wherein the third pads surrounds the first normal die and the failed die and the fourth pads surrounds the first pads;

at least a second normal die having a plurality of second pads stacked over the failed die;

a plurality of conductive wires electrically connecting the first pads on the first normal die and the third pads;

a plurality of reworking conductive wires electrically connecting the second pads on the second normal die and the fourth pads; and a plurality of contacts on the second surface of the substrate, wherein each of the third and the fourth pads is electrically coupled to the contacts through relative a plurality of electrical connecting paths.

11. The repairable multi-chip module of claim 10, wherein material of the conductive wires includes aurum.

12. The repairable multi-chip module of claim 10, wherein material of the reworking conductive wires includes aurum.

13. The repairable multi-chip module of claim 10, further comprises an insulating material covering the first surface of the substrate.

14. The repairable multi-chip module of claim 13, wherein the insulating material includes resin.

15. The repairable multi-chip module of claim 13, wherein the insulating material includes epoxy.

16. The repairable multi-chip module of claim 10, further comprises a solder material formed on the contacts.

17. The repairable multi-chip module of claim 16, wherein the solder material includes solder paste.

18. The repairable multi-chip module of claim 16, wherein the solder material includes solder ball.

19. The repairable multi-chip module of claim 10, wherein the second normal die has been previously tested.

20. The repairable multi-chip module of claim 10, wherein the function of the second normal die is the same as that of the failed die.

* * * * *